(12) United States Patent
Hamano

(10) Patent No.: US 8,385,859 B2
(45) Date of Patent: Feb. 26, 2013

(54) ELECTRONIC APPARATUS, TRANSMITTER, AMPLIFIER, AND AMPLIFIER CONTROL METHOD

(75) Inventor: Mitsuharu Hamano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 94 days.

(21) Appl. No.: 13/040,693

(22) Filed: Mar. 4, 2011

(65) Prior Publication Data

US 2011/0223875 A1    Sep. 15, 2011

(30) Foreign Application Priority Data

Mar. 12, 2010    (JP) .................................. 2010-56584

(51) Int. Cl.
*H04B 1/04*    (2006.01)

(52) U.S. Cl. .................... 455/127.1; 455/127.2; 455/91; 455/126

(58) Field of Classification Search ............... 455/127.1, 455/126, 91, 127.2
See application file for complete search history.

(56) References Cited

U.S. PATENT DOCUMENTS

| 4,074,266 | A | * | 2/1978 | Yokoi et al. | 342/368 |
|---|---|---|---|---|---|
| 5,101,172 | A | * | 3/1992 | Ikeda et al. | 330/136 |
| 5,185,585 | A | * | 2/1993 | Newell et al. | 331/46 |
| 5,680,420 | A | * | 10/1997 | Reime | 375/350 |
| 6,300,826 | B1 | | 10/2001 | Mathe et al. | |

FOREIGN PATENT DOCUMENTS

| JP | 8-102623 | 4/1996 |
|---|---|---|
| JP | 2003-533116 | 11/2003 |
| JP | 2009-124476 | 6/2009 |

* cited by examiner

*Primary Examiner* — Sanh Phu
(74) *Attorney, Agent, or Firm* — Katten Muchin Rosenman LLP

(57) ABSTRACT

An electronic apparatus having communications capabilities, including: an envelope detector that detects an envelope of a transmission signal; a differentiator that differentiates the envelope with respect to time to obtain differential components; a filtering processor that filters the differential components; an integrator that integrates the filtered differential components with respect to time to generate an envelope tracking signal; an amplifying unit that amplifies the transmission signal; and a voltage controller that controls, in accordance with the envelope tracking signal, a voltage the amplifying unit uses to amplify the transmission signal.

9 Claims, 12 Drawing Sheets

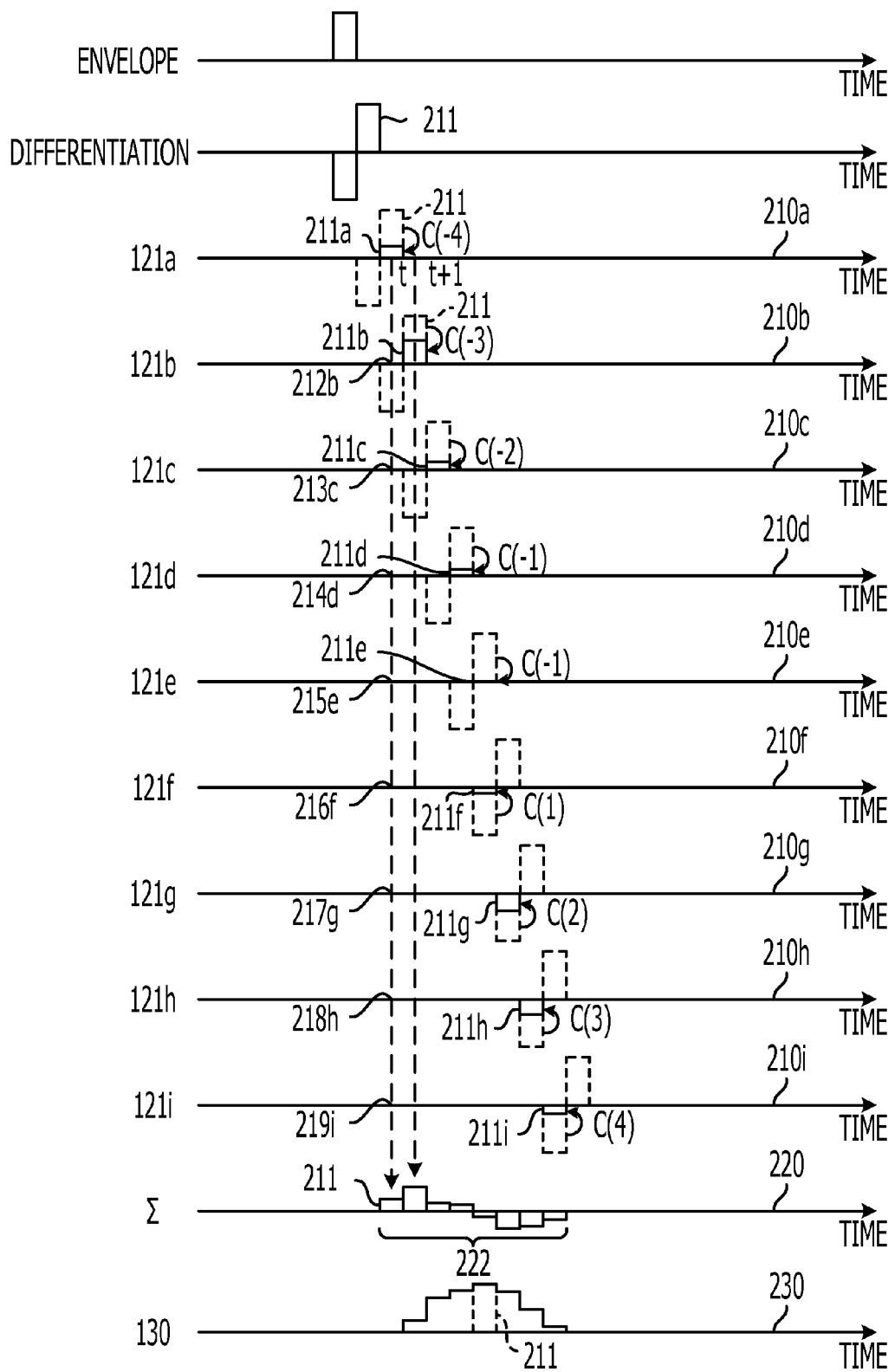

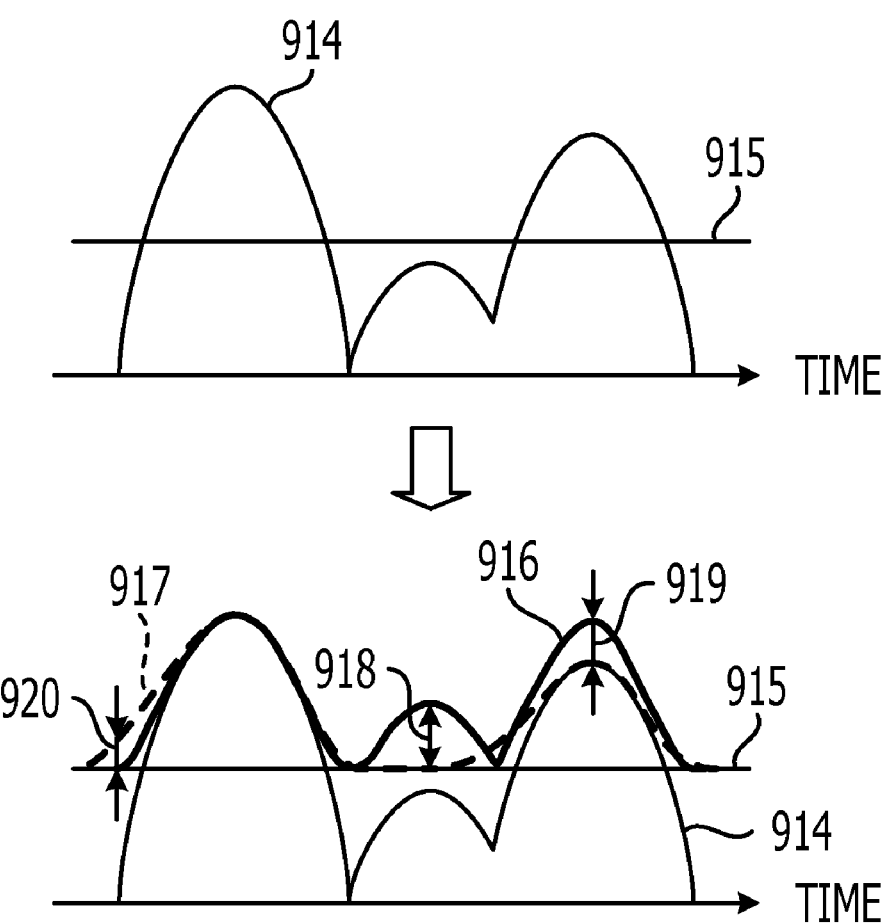

US 8,385,859 B2

ELECTRONIC APPARATUS, TRANSMITTER, AMPLIFIER, AND AMPLIFIER CONTROL METHOD

CROSS-REFERENCE TO RELATED APPLICATIONS

This application is related to and claims priority to Japanese Patent Application No. 2010-56584 filed on Mar. 12, 2010 and herein incorporated by reference.

BACKGROUND

1. Field

The present invention relates to an electronic apparatus, a transmitter, an amplifier, and an amplifier control method.

2. Description of the Related Art

Envelope tracking (ET) is known as a technique that improves efficiency of power use in an amplifier included in a transmitting unit of an electronic apparatus, such as a mobile terminal or a radio relay apparatus. Examples of the envelope tracking include a technique that improves efficiency of power use in an amplifier by controlling a drain voltage in accordance with changes in the envelope of a transmission signal (drain voltage control (DVC)).

Specifically, drain voltage control is a technique that changes a drain voltage of an amplifier in accordance with the amplitude of an envelope of a transmission signal, and thereby allows the amplifier to operate consistently in a nearly saturated state and achieves highly efficient operation of the amplifier. Changing the drain voltage in accordance with the amplitude of the envelope involves use of an envelope tracking signal obtained by conversion of the envelope.

As a technique for controlling an amplifier, there has been proposed a technique that integrates an input signal in the previous cycle using an integrator, subtracts the resulting value from the current input signal, and controls an amplifier such that its output is proportional to a result of the subtraction. There has also been proposed a technique that determines a difference between an output of an amplifier and a predetermined reference value, and controls the amplifier using a value obtained by integrating the difference. Additionally, there has been proposed a technique that controls a direct-current voltage of an amplifier such that it is proportional to an envelope of a transmission signal.

For changing a drain voltage such that it is proportional to an envelope value of a transmission signal, an electronic apparatus needs to be equipped with a high-speed device that can respond to changes in envelope. Examples of such a device include a digital-to-analog converter (DAC) and an amplifier. Mounting such a high-speed device is costly and increases power consumption. Therefore, a device having a lower response speed will be used in practice.

When a drain voltage is made proportional to an envelope value, a peak value of an envelope tracking signal does not agree with that of the envelope. This results in an excess or insufficient supply of power at a peak time. To prevent an excess or insufficient supply of power at peak times, an amplifier may be controlled, using an offset, such that one peak value of an envelope agrees with that of an envelope tracking signal. However, even when the agreement of one peak value is achieved using an offset, the agreement of other peak values cannot be achieved and thus, an excess or insufficient supply of power occurs. Thus, an efficient supply of power cannot be achieved simply by making a drain voltage proportional to an envelope.

To control a drain voltage such that an efficient supply of power can be achieved, it is desirable that the following conditions be satisfied. A first condition is that a control signal is processed in accordance with a limit of the response speed of a device that performs drain voltage control. A second condition is that a control signal is processed in accordance with a nonlinear response characteristic of the device that performs drain voltage control. The nonlinear response characteristic is, for example, that there is a difference in the response speed of the device between rising and falling edges of power supply. A third condition is that to minimize unnecessary power output, a waveform of the output of an amplifier is kept as similar as possible to an envelope of an original transmission signal.

As a known drain voltage control technique for avoiding these constraints, there is an amplifier having a configuration illustrated in FIG. 8. FIG. 8 is a block diagram illustrating a known transmitter, which serves as an electronic apparatus, including an amplifier that performs drain voltage control.

In this known technique, an envelope of a transmission signal output from a transmission signal generator 901 is detected by an envelope detector 902. A nonlinear transducer 903 refers to a look-up table (LUT) 904 to convert the envelope into an envelope tracking signal. In the LUT 904, a response characteristic of a device that performs drain voltage control is recorded in advance. After the envelope tracking signal is band-limited by a low-pass filter (LPF) 905 and a change of the signal is slowed down, a DAC 906 converts the envelope tracking signal into an analog signal. In accordance with the resulting envelope tracking signal, a drain voltage controller 907 controls a drain voltage of an amplifying unit 910. A delaying unit 908 delays the transmission signal. A DAC 909 converts the transmission signal into an analog signal. The amplifying unit 910 amplifies the transmission signal using the drain voltage controlled by the drain voltage controller 907, and outputs the amplified transmission signal.

FIG. 9 illustrates an example of the LUT 904. The horizontal axis of the graph illustrated in FIG. 9 represents an envelope value, and the vertical axis of the graph represents an output value of the nonlinear transducer 903. A curve 911 represents the output value corresponding to the envelope value input in the LUT 904. A line 913 indicates a lower limit of the output value at which a source voltage can be controlled. A line 912 indicates a direct proportion between the envelope value and the output value. As indicated by the curve 911, the output value does not fall below the lower limit for the source voltage control even at the smallest envelope value. When the envelope value increases to reach a certain level, the envelope value and the output value agree with each other.

FIG. 10 illustrates an envelope conversion process using the LUT 904. The upper graph in FIG. 10 indicates a value of an input envelope 914. The lower graph in FIG. 10 indicates an envelope tracking signal 916 generated by using the LUT 904, and an envelope tracking signal 917 which allows a more efficient supply of power. A line 915 indicates a lower limit of an output value at which a source voltage can be controlled. The envelope tracking signal 917 is an envelope tracking signal that takes into account a limit of a response speed and a nonlinear response characteristic of a device and has peak values which agree with the corresponding peak values of the envelope 914.

Japanese Laid-open Patent Publication Nos. 2009-124476 and 8-102623, and Japanese National Publication of International Patent Application No. 2003-533116 are examples of related art.

SUMMARY

Embodiments discussed herein are related to an electronic apparatus having communications capabilities, including: an envelope detector that detects an envelope of a transmission signal; a differentiator that differentiates the envelope with respect to time to obtain differential components; a filtering processor that filters the differential components; an integrator that integrates the filtered differential components with respect to time to generate an envelope tracking signal; an amplifying unit that amplifies the transmission signal; and a voltage controller that controls, in accordance with the envelope tracking signal, a voltage the amplifying unit uses to amplify the transmission signal.

The object and advantages of the invention will be realized and attained by the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 3 illustrates summing of differential components by which respective coefficients are multiplied.

FIG. 10 illustrates an envelope conversion process using the look-up table.

DETAILED DESCRIPTION OF THE EMBODIMENTS

Figure 1:
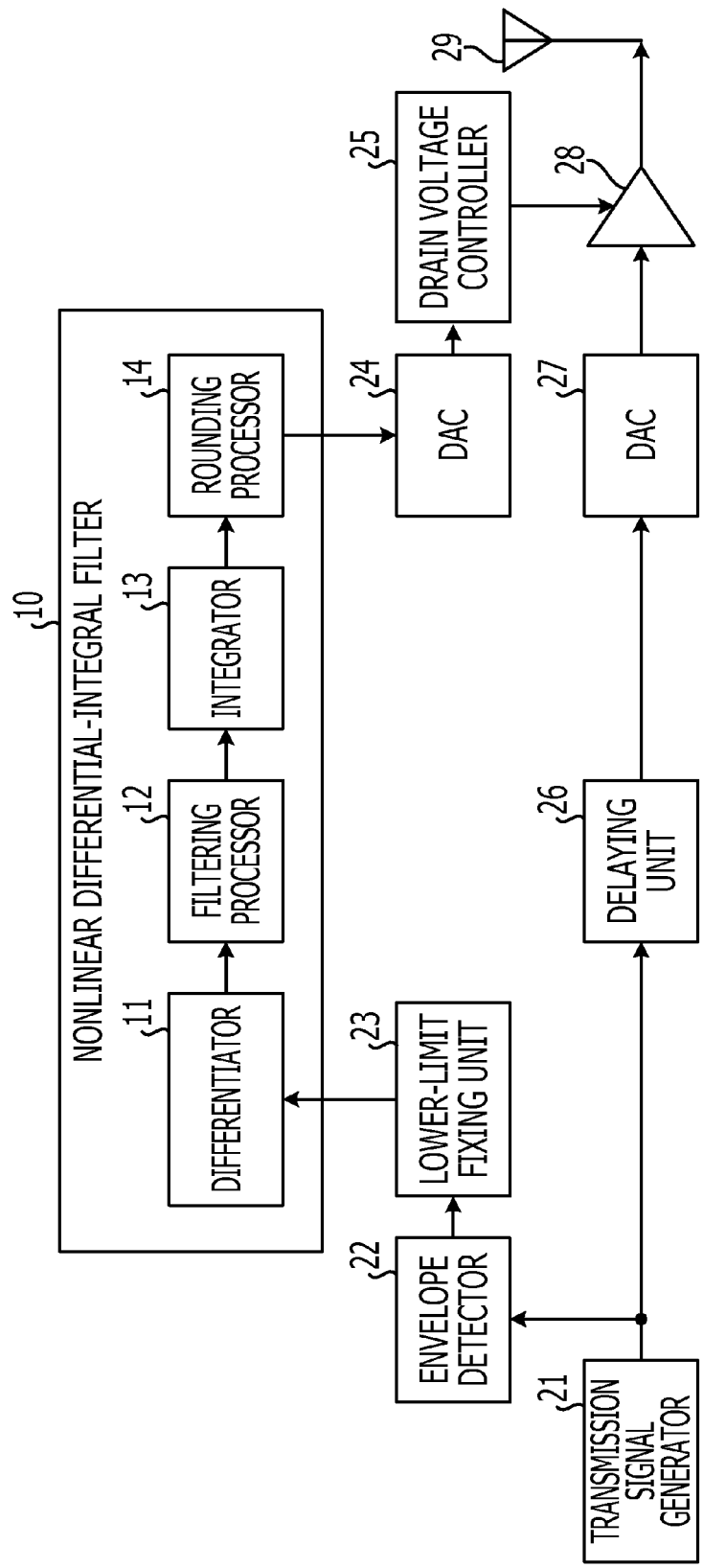
FIG. 1 is a block diagram illustrating a transmitter according to an embodiment.

In the known method in which an envelope is converted by referring to the LUT 904, since an original envelope is converted by primary conversion, an envelope tracking signal is sensitive to the effect of the original envelope. Therefore, the known method described above has the following problems.

First, since a voltage higher than or equal to a lower limit of an operating range of a source voltage is supplied to a signal below the lower limit, unnecessary power consumption occurs. For example, as indicated by an arrow 918 in FIG. 10, a difference between the envelope tracking signal 916 and the envelope tracking signal 917 represents such unnecessary power consumption.

Also, when an output corresponding to a peak of a waveform determined by referring to a look-up table exceeds an original peak value, excess power is supplied at a peak time. For example, as indicated by an arrow 919 in FIG. 10, a difference between the envelope tracking signal 916 and the envelope tracking signal 917 represents such excess power.

Additionally, since an output is determined simply in accordance with an envelope value by referring to a look-up table, no difference can be made in the response characteristic of an envelope tracking signal between the rising and falling edges. Therefore, for example, if a device that performs drain voltage control has a nonlinear response characteristic between the rising and falling edges, this method cannot accommodate the response characteristic of the device. For example, an arrow 920 in FIG. 10 indicates that the envelope tracking signal 916 generated by referring to the LUT 904 does not correspond with a nonlinear response characteristic of a device that performs drain voltage control.

As a way to accommodate a difference in response characteristic of a device between the rising and falling edges, two different look-up tables for the rising and falling edges may be prepared and switched from one to the other. However, switching between look-up tables causes the following problems. First, when a look-up table being referred to is switched to the other, a discontinuity occurs in an envelope tracking signal. Then, an additional look-up table is required to solve this discontinuity problem. Thus, as the number of look-up tables to be referred to increases, a waveform of an envelope tracking signal becomes different from that of an envelope tracking signal for drain voltage control which allows an efficient supply of power.

The technique to be disclosed herein has been made in view of the circumstances described above. The technique provides an electronic apparatus, a transmitter, an amplifier, and an amplifier control method for generating an envelope tracking signal that has a waveform similar to that of an envelope of an original transmission signal and takes into account a response speed limit and a nonlinear response characteristic of a device that performs drain voltage control.

According to an embodiment, an electronic apparatus to be disclosed by the present application includes the following components: an envelope detector that detects an envelope of a transmission signal; a differentiator that differentiates the envelope with respect to time to obtain differential components; a filtering processor that filters the differential components; an integrator that integrates the filtered differential components with respect to time to generate an envelope tracking signal; an amplifying unit that amplifies the transmission signal; and a voltage controller that controls, in accordance with the envelope tracking signal, a voltage the amplifying unit uses to amplify the transmission signal.

According to an embodiment of an electronic apparatus, a transmitter, an amplifier, and an amplifier control method to be disclosed by the present application, it is possible to generate an envelope tracking signal that has a waveform similar to that of an envelope of an original transmission signal and takes into account a response speed limit and a nonlinear response characteristic of a device that performs drain voltage control. By controlling a drain voltage in accordance with the envelope tracking signal generated, it is possible to achieve an efficient supply of power for signal amplification.

Hereinafter, embodiments of an electronic apparatus, a transmitter, an amplifier, and an amplifier control method to be disclosed by the present application will be described in detail with reference to the drawings. Note that the electronic apparatus, transmitter, amplifier, and amplifier control method to be disclosed by the present application will not be limited to the embodiments described below.

FIG. 1 is a block diagram illustrating a transmitter serving as an electronic apparatus according to an embodiment. The transmitter according to the present embodiment includes a transmission signal generator 21, an envelope detector 22, a lower-limit fixing unit 23, a nonlinear differential-integral filter 10, a DAC 24, and a drain voltage controller 25. The transmitter according to the present embodiment further includes a delaying unit 26, a DAC 27, an amplifying unit 28, and an antenna 29.

The transmission signal generator 21 generates a transmission signal which is a digital signal containing data to be transmitted. The transmission signal generator 21 outputs the transmission signal to the envelope detector 22 and to the delaying unit 26.

The envelope detector 22 receives input of the transmission signal from the transmission signal generator 21. The envelope detector 22 performs envelope detection on the transmission signal to detect an envelope of the transmission signal. Here, a value of the envelope detected by the envelope detector 22 represents an amplitude of the envelope at a given time. In other words, envelope values indicate respective amplitudes of the continuous envelope in time sequence at predetermined intervals. For example, the next value of the amplitude of the envelope at time t is the amplitude of the envelope at time t+1, and the previous value of the amplitude of the envelope at time t is the amplitude of the envelope at time t−1.

The envelope detector 22 outputs the envelope of the transmission signal to the lower-limit fixing unit 23.

The lower-limit fixing unit 23 stores in advance a lower limit of a source voltage that the drain voltage controller 25 can control. Hereinafter, a lower limit of a source voltage that the drain voltage controller 25 can control will be referred to as a "source-voltage-control lower limit".

The lower-limit fixing unit 23 receives input of the envelope of the transmission signal from the envelope detector 22. Of values of the envelope, those below the source-voltage-control lower limit are converted to the source-voltage-control lower limit by the lower-limit fixing unit 23. In other words, the lower-limit fixing unit 23 sets all signal values used in filtering (described below) to be greater than or equal to the source-voltage-control lower limit. Specifically, for example, if an envelope value at time t is below the source-voltage-control lower limit, the lower-limit fixing unit 23 converts the envelope value at time t to the source-voltage-control lower limit. Hereinafter, a process in which envelope values below a source-voltage-control lower limit is converted to the source-voltage-control lower limit may be referred to as a process in which a lower limit of an envelope is fixed.

Thus, when a lower limit of an envelope is fixed, an envelope tracking signal transmitted to the drain voltage controller 25 can be greater than or equal to the source-voltage-control lower limit. This can prevent a situation where the drain voltage controller 25 is unable to control the source voltage due to a lack of voltage.

The lower-limit fixing unit 23 outputs, to the nonlinear differential-integral filter 10, a signal in which envelope values below the source-voltage-control lower limit have been changed to the source-voltage-control lower limit.

Figure 2:
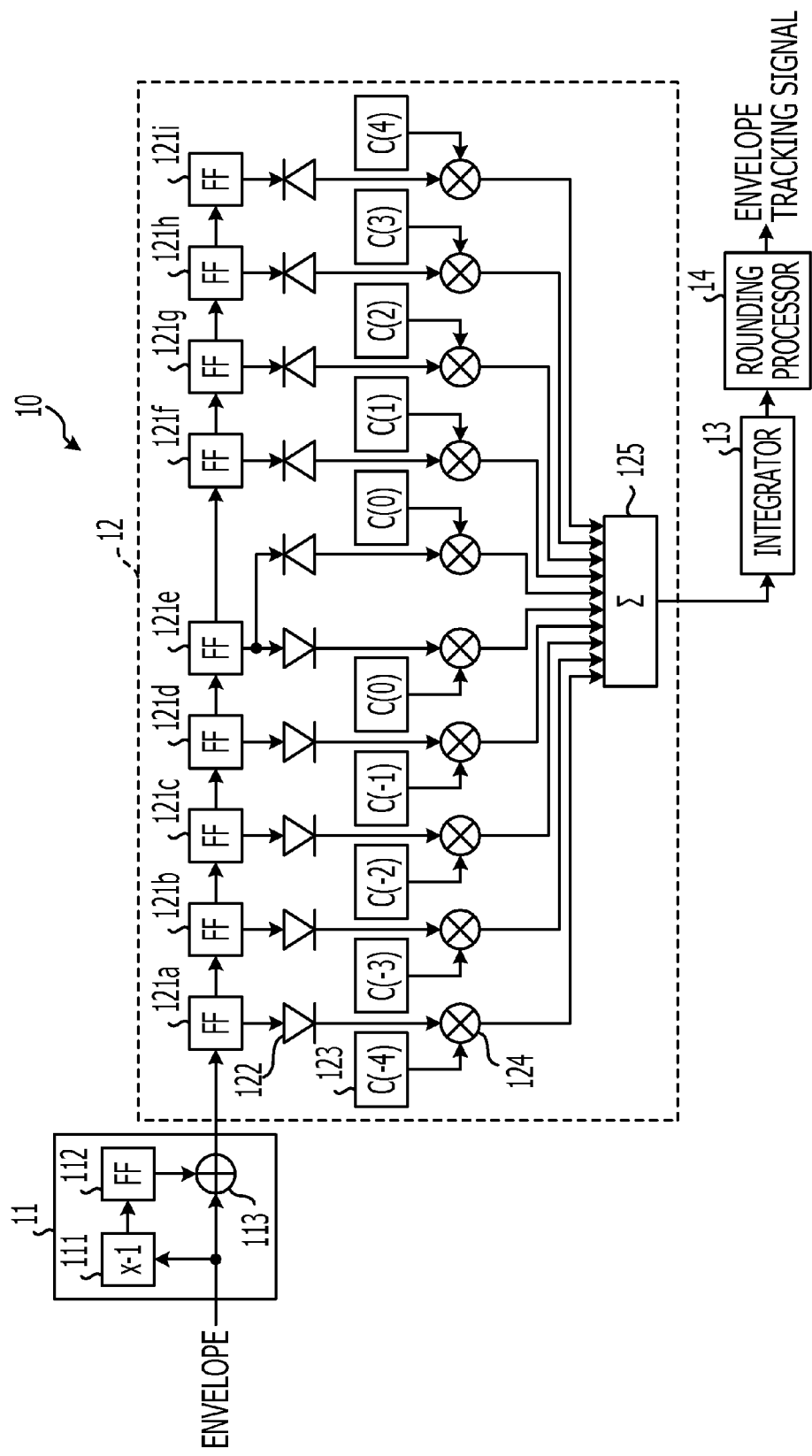
FIG. 2 illustrates a configuration of a nonlinear differential-integral filter.

The nonlinear differential-integral filter 10 includes a differentiator 11, a filtering processor 12, an integrator 13, and a rounding processor 14. FIG. 2 illustrates a configuration of the nonlinear differential-integral filter 10. The nonlinear differential-integral filter 10 will now be described in detail with reference to FIG. 2.

The differentiator 11 includes a sign inverter 111, a tap 112, and an adder 113.

The differentiator 11 receives, from the lower-limit fixing unit 23, the signal in which envelope values below the source-voltage-control lower limit have been changed to the source-voltage-control lower limit. Hereinafter, values of the signal in which envelope values below the source-voltage-control lower limit have been changed to the source-voltage-control lower limit will be simply referred to as "envelope values".

The differentiator 11 receives the envelope values one by one in time sequence. The envelope values received by the differentiator 11 are transmitted to the sign inverter 111 and the adder 113.

The sign inverter 111 multiplies the received envelope value at time t−1 by −1 to invert the sign of the envelope value. Here, an envelope value at time t refers to an envelope value at a given time, and an envelope value at time t−1 refers to an envelope value immediately before that at time t in time sequence. The sign inverter 111 then outputs the sign-inverted envelope value at time t−1 to the tap 112.

The tap 112 is a flip-flop ("FF") circuit. The tap 112 holds the sign-inverted envelope value at time t−1 input from the sign inverter 111 until the adder 113 receives input of the envelope value at time t. When the adder 113 receives input of the envelope value at time t, the tap 112 outputs the sign-inverted envelope value at time t−1 to the adder 113.

The adder 113 receives input of the sign-inverted envelope value at time t−1 from the tap 112. The adder 113 adds the received envelope value at time t to the sign-inverted envelope value at time t−1. In other words, the adder 113 subtracts the envelope value at time t−1 from the envelope value at time t. Subtracting the envelope value at time t−1 from the envelope value at time t corresponds to differentiation performed by the differentiator 11. Hereinafter, a value obtained by subtracting the envelope value at time t−1 from the envelope value at time t will be referred to as a differential component at time t. Then, the adder 113 outputs the obtained differential component at time t to the filtering processor 12.

The adder 113 determines differential components of the envelope at respective times in time sequence and outputs the obtained differential components sequentially to the filtering processor 12.

The filtering processor 12 includes taps 121a to 121i. Hereinafter, the taps 121a to 121i each may be simply referred to as a "tap 121" without distinction. The filtering processor 12 further includes diodes 122 corresponding to the respective taps 121, coefficient storage units 123 each storing a coefficient C(p) or C(n) for the corresponding tap 121, and multipliers 124 corresponding to the respective taps 121. Here, the character "p" denotes negative integers including zero, the character "n" denotes positive integers including zero, and "p+n" denotes a number obtained by adding one to the number of the taps 121. The filtering processor 12 further includes a summing unit 125.

The taps 121a to 121i are arranged in series as illustrated in FIG. 2. The tap 121a receives input of a differential component from the adder 113. Simultaneously with receiving another differential component from the adder 113, the tap 121a outputs the differential component held therein to the next tap 121b. Likewise, simultaneously with receiving another differential component, each tap 121 outputs a differential component held therein to the next tap 121, that is, for example, the tap 121b outputs a differential component held therein to the tap 121c, and the tap 121c outputs a differential component held therein to the tap 121d. Then, simultaneously with receiving another differential component from the tap 121h, the tap 121i discards a differential component held therein.

That is, when the tap 121a holds a differential component at time t, the tap 121b holds a differential component at time t−1, the tap 121c holds a differential component at time t−2, . . . , and the tap 121i holds a differential component at time t−8.

The taps 121 output the respective differential components held therein to the diodes 122 connected thereto.

In the present embodiment, the tap 121e is located in the center of the taps 121 arranged in series. Such a tap located in the center of the taps arranged in series will be referred to as a "center tap".

The diodes 122 include those that select and pass only positive values and those that select and pass only negative values. Referring to FIG. 2, the diodes 122 represented by inverted triangles are diodes that select and pass only positive values, and the diodes 122 represented by triangles are diodes that select and pass only negative values. The diodes 122 that select and pass only positive values are connected to the respective taps 121 arranged to one side of the center tap adjacent to the adder 113. The diodes 122 that select and pass only negative values are connected to the respective taps 121 arranged to the other side of the center tap remote from the adder 113. Two diodes 122, one selecting and passing only positive values and the other selecting and passing only negative values, are connected to the center tap. In the present embodiment, the diodes 122 that select and pass only positive values are connected to the respective taps 121a to 121d, and the diodes 122 that select and pass only negative values are connected to the respective taps 121f to 121i. At the same time, the two diodes 122 that respectively select and pass only positive values and negative values are connected to the tap 121e.

When a differential component input from the corresponding tap 121 is a positive value, the diode 122 that selects and passes only positive values outputs the differential component to the multiplier 124 connected thereto. When a differential component input from the corresponding tap 121 is a negative value, the diode 122 that selects and passes only positive values discards the differential component.

When a differential component input from the corresponding tap 121 is a negative value, the diode 122 that selects and passes only negative values outputs the differential component to the multiplier 124 connected thereto. When a differential component input from the corresponding tap 121 is a positive value, the diode 122 that selects and passes only negative values discards the differential component.

That is, only when the taps 121a to 121d hold positive differential components are the differential components input to the respective multipliers 124 corresponding to the respective taps 121a to 121d. Also, only when the taps 121f to 121i hold negative differential components are the differential components input to the respective multipliers 124 corresponding to the respective taps 121f to 121i. When a differential component held by the tap 121e (center tap) is a positive value, the differential component is input to the multiplier 124 connected to the diode 122 that selects and passes only positive values. When a differential component held by the tap 121e (center tap) is a negative value, the differential component is input to the multiplier 124 connected to the diode 122 that selects and passes only negative values.

The coefficient storage units 123 store predetermined coefficients corresponding to the respective taps 121. The coefficient storage units 123 corresponding to the respective diodes 122 that select and pass only positive values store coefficients $C(p)$ (where "p" denotes negative integers including zero), and the coefficient storage units 123 corresponding to the respective diodes 122 that select and pass only negative values store coefficients $C(n)$ (where "n" denotes positive integers including zero). Here, "p+n" denotes a number obtained by adding one to the number of the taps 121, and $|p|=|n|$ is satisfied. In the present embodiment, where the number of the taps 121 is nine, "p" is an integer from $-4$ to $0$ and "n" is an integer from $0$ to $4$. Specifically, the coefficient storage units 123 corresponding to the respective taps 121a to 121d store $C(-4)$, $C(-3)$, $C(-2)$, and $C(-1)$, and the coefficient storage units 123 corresponding to the respective taps 121f to 121i store $C(1)$, $C(2)$, $C(3)$, and $C(4)$. Also, the coefficient storage unit 123 corresponding to the tap 121e and to the diode 122 that selects and passes only positive values stores $C(p)=C(0)$, and the coefficient storage unit 123 corresponding to the tap 121e and to the diode 122 that selects and passes only negative values stores $C(n)=C(0)$. That is, $C(-4)$ to $C(0)$ are coefficients for positive differential components, and $C(0)$ to $C(4)$ are coefficients for negative differential components. Thus, coefficients for positive differential components are arranged for the taps 121 located to one side of the center tap adjacent to the adder 113, and coefficients for negative differential components are arranged for the taps 121 located to the other side of the center tap remote from the adder 113. This can bring a differential component to zero at a peak position of an envelope. When a differential component is zero at a peak position of an envelope, a peak point of the envelope and that of an envelope tracking signal can be made coincident with each other in terms of timing. Hereinafter, the above-described arrangement of coefficients for positive and negative differential components with respect to the center tap will be referred to as a "condition 1".

Next, as a condition for determining the coefficients $C(p)$ and $C(n)$, there is a condition in which the sum of the coefficients $C(p)$ is made equal to the sum of the coefficients $C(n)$. When the sum of the coefficients $C(p)$ is equal to that of the coefficients $C(n)$, values at the beginning and end of an envelope tracking signal generated by converting an envelope agree with each other. Here, a value at the beginning refers to a value at the beginning of an envelope tracking signal in terms of time, and a value at the end refers to a value at the end of an envelope tracking signal in terms of time. If, unlike the present embodiment, the sum of the coefficients $C(p)$ is set to be greater than that of the coefficients $C(n)$, the sum of coefficients for positive differential components is greater than the sum of coefficients for negative differential components. In this case, a rise in the waveform of an envelope tracking signal is greater than a fall in the waveform of the envelope tracking signal. As a result, a value of the envelope tracking signal goes on increasing and the envelope tracking signal dissipates. Hereinafter, a condition in which the sum of coefficients for positive differential components is made equal to the sum of coefficients for negative differential components will be referred to as a "condition 2".

When the condition 1 and the condition 2 are both satisfied, the nonlinear differential-integral filter 10 can generate an envelope tracking signal in which its peak timing coincides with that of the original envelope and its peak value agrees with that of the original envelope.

The coefficients described above are preferably set such that the envelope tracking signal corresponds with a response characteristic of the drain voltage controller 25. By varying the number of zero coefficients and the magnitudes of coefficients, it is possible to generate an envelope tracking signal that corresponds with a response characteristic of the drain voltage controller 25. This is because since a waveform ends when a positive or negative coefficient is brought to zero, a waveform cycle can be shortened by increasing the number of zero coefficients. Also, the greater the magnitude of a coefficient, the greater the amplitude of a waveform. For example, when the drain voltage controller 25 has a response characteristic in which a rising edge is gradual and a falling edge is steep, an envelope tracking signal can correspond with the response characteristic of the drain voltage controller 25 when the number of zero coefficients for negative differential components is set to be greater than that of zero coefficients for positive differential components. Specifically, coefficients for positive and negative differential components may be as follows: (C(−4), C(−3), C(−2), C(−1), C(0))=(1/5, 1/5, 1/5, 1/5, 1/5); and (C(0), C(1), C(2), C(3), C(4))=(1/3, 1/3, 1/3, 0, 0). With such coefficients, an envelope tracking signal having a gradual rising edge and a steep falling edge can be generated.

Each multiplier 124 receives input of a differential component from the diode 122 connected thereto. At the same time, the multiplier 124 obtains from the corresponding coefficient storage unit 123 a coefficient C(p) or C(n) that corresponds to the tap 121 corresponding to the multiplier 124. The multiplier 124 multiplies the differential component received from the diode 122 by the coefficient obtained from the coefficient storage unit 123. Then, the multiplier 124 outputs a result of the multiplication to the summing unit 125. The multiplier 124 that multiplies, by C(p), a differential component input from the corresponding diode 122 that selects and passes only positive values is an example of a first multiplier. The multiplier 124 that multiplies, by C(n), a differential component input from the corresponding diode 122 that selects and passes only negative values is an example of a second multiplier.

The summing unit 125 receives input of a multiplication result from each of the multipliers 124. The summing unit 125 then sums the multiplication results received. A summing operation performed by the summing unit 125 will now be described with reference to FIG. 3. FIG. 3 illustrates summing of differential components by which respective coefficients are multiplied. FIG. 3 schematically illustrates a process in which results of multiplications of differential components of an envelope by respective coefficients are summed. In FIG. 3, the horizontal axes represent time. A graph on a horizontal axis 210a indicates a process for a differential component held by the tap 121a. Similarly, graphs on horizontal axes 210b to 210i indicate processes for differential components held by the respective taps 121b to 121i. A graph/on a horizontal axis 220 indicates a state in which the results of multiplications of differential components 211 by respective coefficients are summed.

Each of the differential components 211 is a differential component for a given envelope value. As indicated in the graph on the horizontal axis 210a, the tap 121a holds the differential component 211 at time t. Also, as indicated in the graph on the horizontal axis 210b, the tap 121b holds the differential component 211 at the subsequent time t+1. A multiplication result 211a is obtained when the multiplier 124 multiplies, by C(−4), the differential component 211 held in the tap 121a at time t. A multiplication result 211b is obtained when the multiplier 124 multiplies, by C(−3), the differential component 211 held in the tap 121b at time t+1. Similarly, multiplication results 211c to 211i are obtained by multiplying the differential components 211 held in the respective taps 121c to 121i at different times by the corresponding coefficients. A multiplication result 212b is obtained by multiplying, by C(−3), a differential component held in the tap 121b at time t. Similarly, multiplication results 213c, 214d, 215e, 216f, 217g, 218h, and 219i are obtained by multiplying differential components held in the respective taps 121c to 121i at time t by the corresponding coefficients.

The summing unit 125 sums the multiplication results 211a, 212b, 213c, 214d, 215e, 216f, 217g, 218h, and 219i obtained by multiplying the differential components held in the respective taps 121a to 121i at time t by the corresponding coefficients. Through this summing operation, the summing unit 125 obtains a sum 221 of the results of the multiplications of the respective differential components by the corresponding coefficients at time t. Similarly, the summing unit 125 sums the multiplication results obtained by multiplying the respective differential components held in the respective taps 121a to 121i at time t+1. Likewise, the summing unit 125 sums the multiplication results at each of different times. Then, as indicated by a graph 222, the summing unit 125 arranges the results of the respective summing operations in time sequence. In the way described above, the summing unit 125 sums the results of multiplications of respective differential components of the envelope. The summing unit 125 then outputs the resulting sum to the integrator 13.

The integrator 13 receives input of the sum from the summing unit 125. The integrator 13 integrates the sum with respect to time. A result of the integration is as indicated by a graph 130 having a horizontal axis 230 in FIG. 3. For example, a result of integration of the differential components 211 is as indicated by a dotted line in the graph 130. The integrator 13 then outputs the integration result to the rounding processor 14.

The rounding processor 14 receives input of the integration result from the integrator 13. The rounding processor 14 performs rounding on the received integration result. For example, the rounding processor 14 rounds off the integration result to a number having significant digits that can be used in drain voltage control. Also, for example, the rounding processor 14 removes a portion of the integration result where voltage saturation occurs. When the rounding processor 14 removes a portion where voltage saturation occurs, unnecessary power consumption can be further reduced. The rounding processor 14 then outputs an envelope tracking signal, which is a rounded integration result, to the DAC 24.

The DAC 24 receives input of the envelope tracking signal from the rounding processor 14. The DAC 24 converts the envelope tracking signal, which is a digital signal, to an analog signal. The DAC 24 then outputs the analog envelope tracking signal to the drain voltage controller 25.

The drain voltage controller 25 receives input of the envelope tracking signal from the DAC 24. Then, in accordance with the envelope tracking signal, the drain voltage controller 25 controls a drain voltage of the amplifying unit 28. The drain voltage controller 25 is an example of a voltage controller. The drain voltage is an example of a voltage used to amplify a transmission signal.

The envelope tracking signal is generated by the nonlinear differential-integral filter 10 as a signal that coincides with the original envelope in terms of peak timing and peak value to reduce unnecessary power consumption, and corresponds to a response characteristic of the drain voltage controller 25. By controlling the drain voltage of the amplifying unit 28 in accordance with the envelope tracking signal, the drain voltage controller 25 can achieve drain voltage control in which unnecessary power consumption can be reduced under its own response characteristic.

The delaying unit 26 receives input of a transmission signal from the transmission signal generator 21. The delaying unit 26 delays the transmission signal by an amount of processing time in the envelope detector 22, the lower-limit fixing unit 23, and the nonlinear differential-integral filter 10. Then, the delaying unit 26 outputs the transmission signal to the DAC 27.

The DAC 27 receives input of the transmission signal from the delaying unit 26. The DAC 27 converts the transmission signal to an analog signal. Then, the DAC 27 outputs the analog transmission signal to the amplifying unit 28.

The amplifying unit 28 receives input of the transmission signal from the DAC 27. The amplifying unit 28 amplifies the transmission signal using the drain voltage controlled by the drain voltage controller 25. Then, the amplifying unit 28 sends out the amplified transmission signal through the antenna 29. The amplifying unit 28 is an example of an amplifying unit.

Figure 4A:
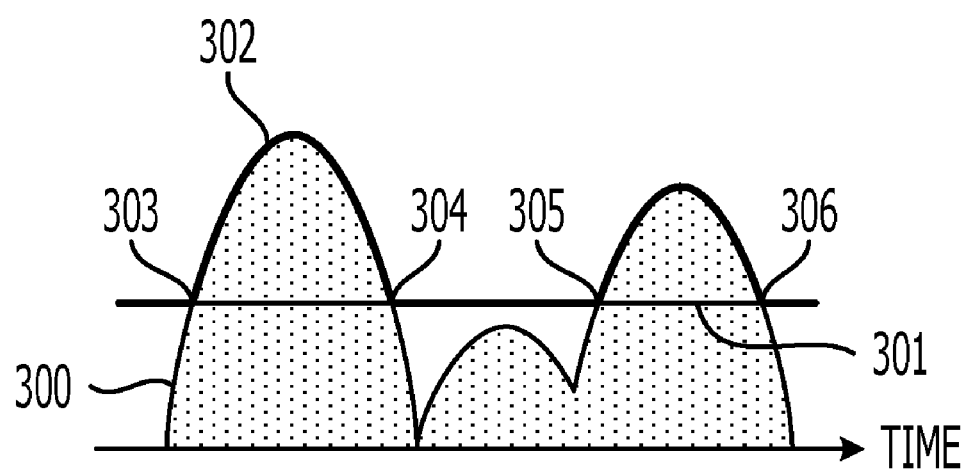
FIG. 4A illustrates a state in which a lower limit of an envelope is fixed.
Figure 4B:
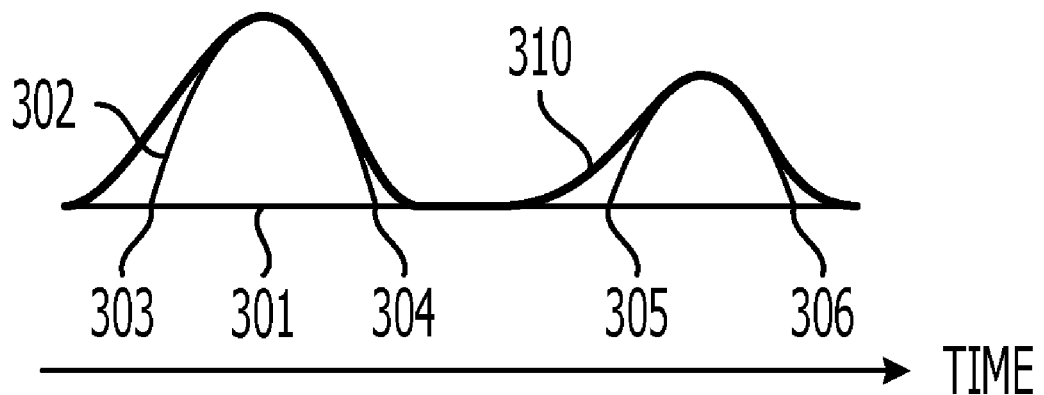
FIG. 4B illustrates an envelope tracking signal generated by the nonlinear differential-integral filter.
Figure 4C:
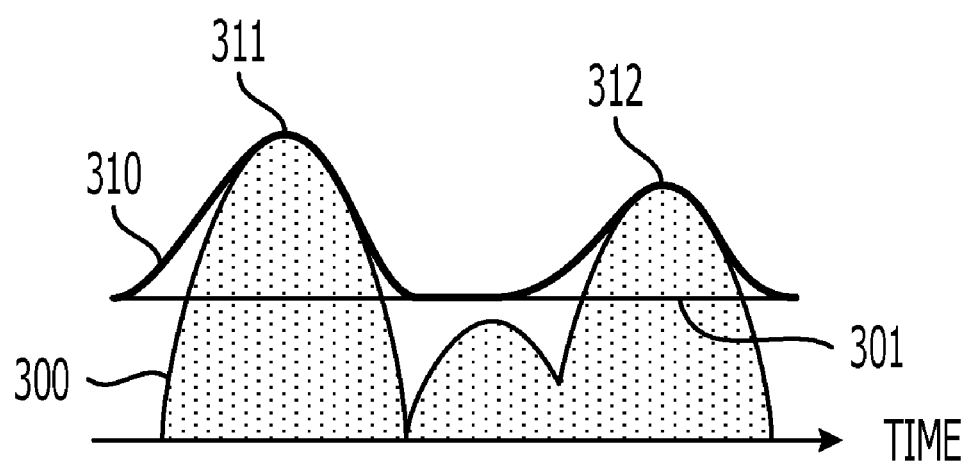
FIG. 4C illustrates a relationship between the envelope and the envelope tracking signal generated by the nonlinear differential-integral filter.

With reference to FIG. 4A to FIG. 4C, processes performed by the lower-limit fixing unit 23 and the nonlinear differential-integral filter 10 will be further described. FIG. 4A illustrates a state in which a lower limit of an envelope is fixed. FIG. 4B illustrates an envelope tracking signal generated by the nonlinear differential-integral filter 10. FIG. 4C illustrates a relationship between the envelope and the envelope tracking signal generated by the nonlinear differential-integral filter 10. In the graphs of FIG. 4A to FIG. 4C, the horizontal axis represents time and the vertical direction represents an envelope value or an envelope tracking signal value.

First, the lower-limit fixing unit 23 receives an envelope 300 illustrated in FIG. 4A from the envelope detector 22. Of values of the envelope 300, those below a source-voltage-control lower limit 301 are converted to the source-voltage-control lower limit 301 by the lower-limit fixing unit 23. Thus by fixing the lower limit of the envelope 300, the lower-limit fixing unit 23 generates a curve 302. As illustrated in FIG. 4A, the curve 302 coincides with the waveform of the envelope 300 in regions where values of the envelope 300 exceed the source-voltage-control lower limit 301, and coincides with the straight line representing the source-voltage-control lower limit 301 in the other regions.

In the curve 302, an abrupt change occurs at each of intersections 303 to 306 where portions coinciding with the envelope 300 meet the source-voltage-control lower limit 301. Therefore, if the drain voltage controller 25 controls a drain voltage in accordance with the curve 302, the drain voltage controller 25 cannot respond quickly enough at the intersections 303 to 306. As a result, the drain voltage controller 25 becomes unable to control the drain voltage at the intersections 303 to 306.

Thus, the nonlinear differential-integral filter 10 performs filtering to smooth out the waveform at the intersections 303 to 306.

The nonlinear differential-integral filter 10 differentiates the curve 302 with respect to time, multiplies the resulting values by respective predetermined coefficients, integrates the results with respect to time, and thereby generates an envelope tracking signal 310 illustrated in FIG. 4B. Here, the coefficients are determined in accordance with the response characteristic of the drain voltage controller 25. Thus, a waveform having a shape corresponding to the response characteristic of the drain voltage controller 25 can be generated. That is, as illustrated in FIG. 4B, the curve 302 is smoothed out at the intersections 303 to 306 into the waveform of the envelope tracking signal 310.

FIG. 4C illustrates the envelope tracking signal 310 generated by the nonlinear differential-integral filter 10 and the original envelope 300 superimposed on the waveform of the envelope tracking signal 310. As indicated by peaks 311 and 312 in FIG. 4C, peaks of the envelope 300 in a range exceeding the source-voltage-control lower limit 301 coincide with those of the envelope tracking signal 310 in terms of both timing and value.

Thus, the lower-limit fixing unit 23 and the nonlinear differential-integral filter 10 generate the envelope tracking signal 310.

Figure 5:
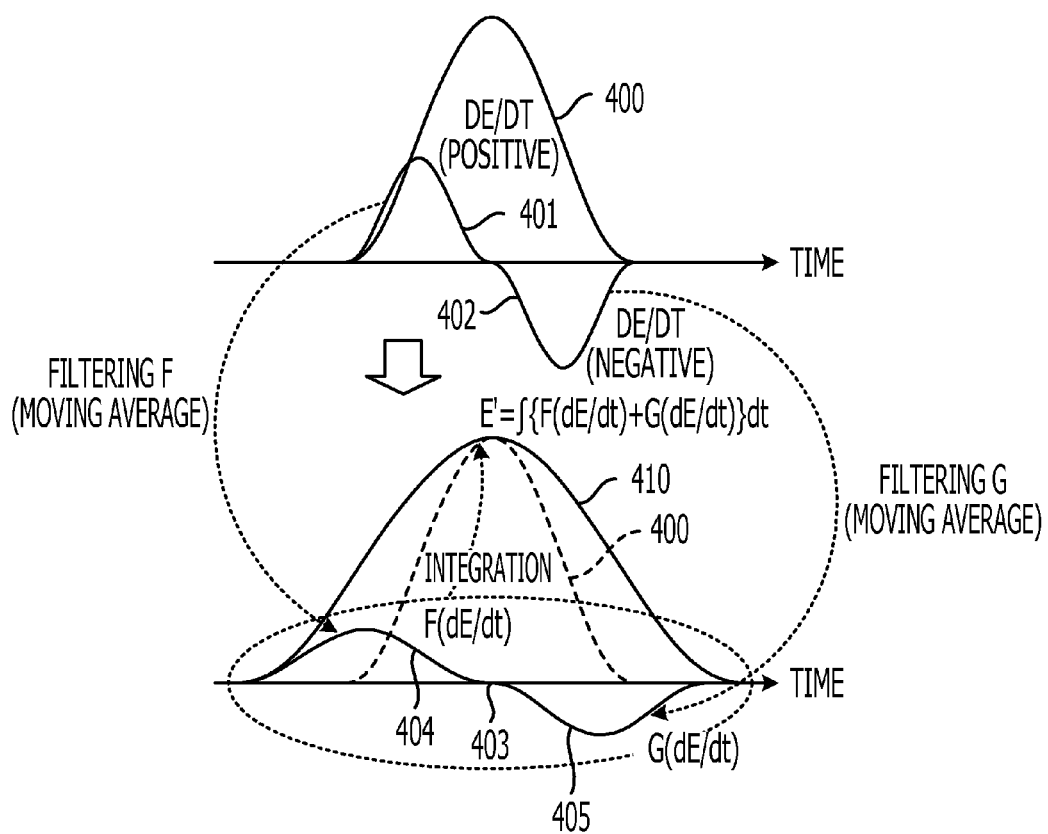
FIG. 5 illustrates a process in which an envelope tracking signal is generated by the nonlinear differential-integral filter.
Figure 6:
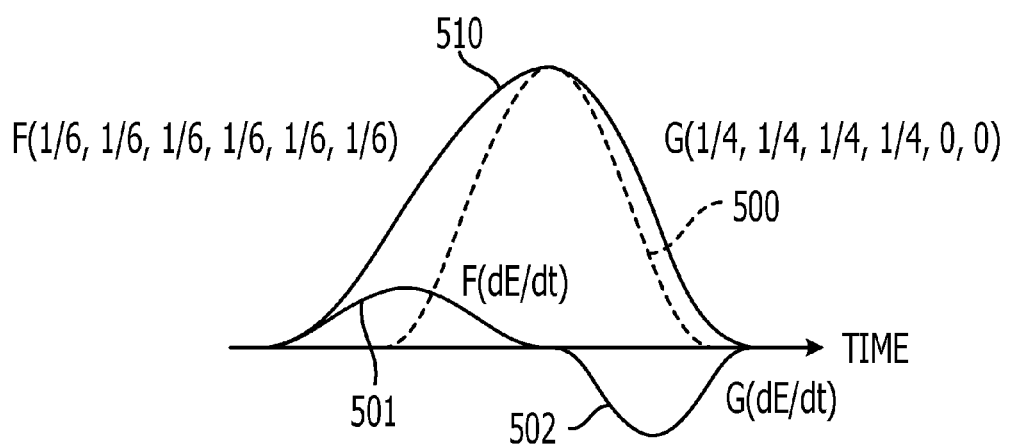
FIG. 6 illustrates a process in which an envelope tracking signal having nonlinearity is generated by the nonlinear differential-integral filter.

Next, with reference to FIG. 5 and FIG. 6, specific examples of envelope tracking signals generated by the nonlinear differential-integral filter 10 will be described. FIG. 5 illustrates a process in which an envelope tracking signal is generated by the nonlinear differential-integral filter 10. FIG. 6 illustrates a process in which an envelope tracking signal having nonlinearity is generated by the nonlinear differential-integral filter 10. Hereinafter, a positive differential component will be referred to as a "positive component", and a negative differential component will be referred to as a "negative component".

First, with reference to FIG. 5, a description will be given of a process in which the nonlinear differential-integral filter 10 generates an envelope tracking signal using a moving average. Here, coefficients for calculating a moving average of differential components are selected as coefficients $C(p)$ and $C(n)$. The nonlinear differential-integral filter 10 receives input of an envelope 400 illustrated in FIG. 5. In the following calculations, the envelope 400 is denoted by E. The nonlinear differential-integral filter 10 differentiates the envelope 400 with respect to time to obtain differential components $dE/dt$. As illustrated in FIG. 5, $dE/dt$ corresponds to positive components 401 and negative components 402 at rising and falling edges of the envelope 400, respectively. Also, $dE/dt$ is zero at a point 403 corresponding to a peak of the envelope 400. Since the envelope 400 is left-right symmetric, the positive components 401 and the negative components 402 are opposite in sign and identical in waveform.

The nonlinear differential-integral filter 10 performs filtering on $dE/dt$. Since a moving average is used in filtering, $dE/dt$ is smoothed out into a curve 404 and a curve 405 by filtering. As illustrated in FIG. 5, the waveform of the filtered positive components 401 is still identical to that of the filtered negative components 402. Here, filtering performed on the positive components 401 is denoted by $F(dE/dt)$, and filtering performed on the negative components 402 is denoted by $G(dE/dt)$.

The nonlinear differential-integral filter 10 integrates the curve 404 and the curve 405 to generate an envelope tracking signal 410. That is, the nonlinear differential-integral filter 10 calculates the equation, $E'=\int\{F(dE/dt)+G(dE/dt)\}dt$, where $E'$ denotes the envelope tracking signal 410.

As illustrated in FIG. 5, the peak of the envelope tracking signal 410 coincides with that of the original envelope 400, and the curve of the envelope tracking signal 410 is gentler than that of the original envelope 400.

With reference to FIG. 6, a description will be given of a process in which an envelope tracking signal having nonlinearity is generated by the nonlinear differential-integral filter 10. In this example, the response of the drain voltage controller 25 is slow at the rising edge and fast at the falling edge. In the case of FIG. 6, the number of the taps 121 is 11. In coefficients $C(p)$ and $C(n)$ for positive and negative components, respectively, "p" is an integer from −5 to 0 and "n" is an integer from 0 to 5.

Since the response of the drain voltage controller 25 is slow at the rising edge, the coefficients $C(p)$ for regulating the rising edge are selected such that the waveform of the positive components is gentle. On the other hand, since the response of the drain voltage controller 25 is fast at the falling edge, the coefficients $C(n)$ for regulating the falling edge are selected such that the waveform of the negative components is as similar as possible to the original waveform and steeper than that of the positive components. Here, filtering performed on the positive components is denoted by $F(dE/dt)$, and filtering performed on the negative components is denoted by $G(dE/dt)$. Coefficients for the filtering F and the filtering G are expressed as (a, b, c, d, e, f). For example, coefficients for filtering are selected as follows: F=(1/6, 1/6, 1/6, 1/6, 1/6, 1/6); and G=(1/4, 1/4, 1/4, 1/4, 0, 0).

If a coefficient is zero, the waveform ends at this point. This means that the greater the number of zero coefficients, the steeper the waveform. Therefore, when differential components of an envelope 500 are filtered using the coefficients described above, a gentle curve 501 and a steep curve 502 can be obtained as illustrated in FIG. 6. Then, integrating the curve 501 and the curve 502 with respect to time can generate an envelope tracking signal 510. The above-described filtering generates the envelope tracking signal 510 having a waveform that is gentle at the rising edge and steep at the falling edge. When a drain voltage is controlled in accordance with this waveform, it is possible to achieve control that corresponds to the response characteristic of the drain voltage controller 25 whose response is slow at the rising edge and fast at the falling edge.

Figure 7:
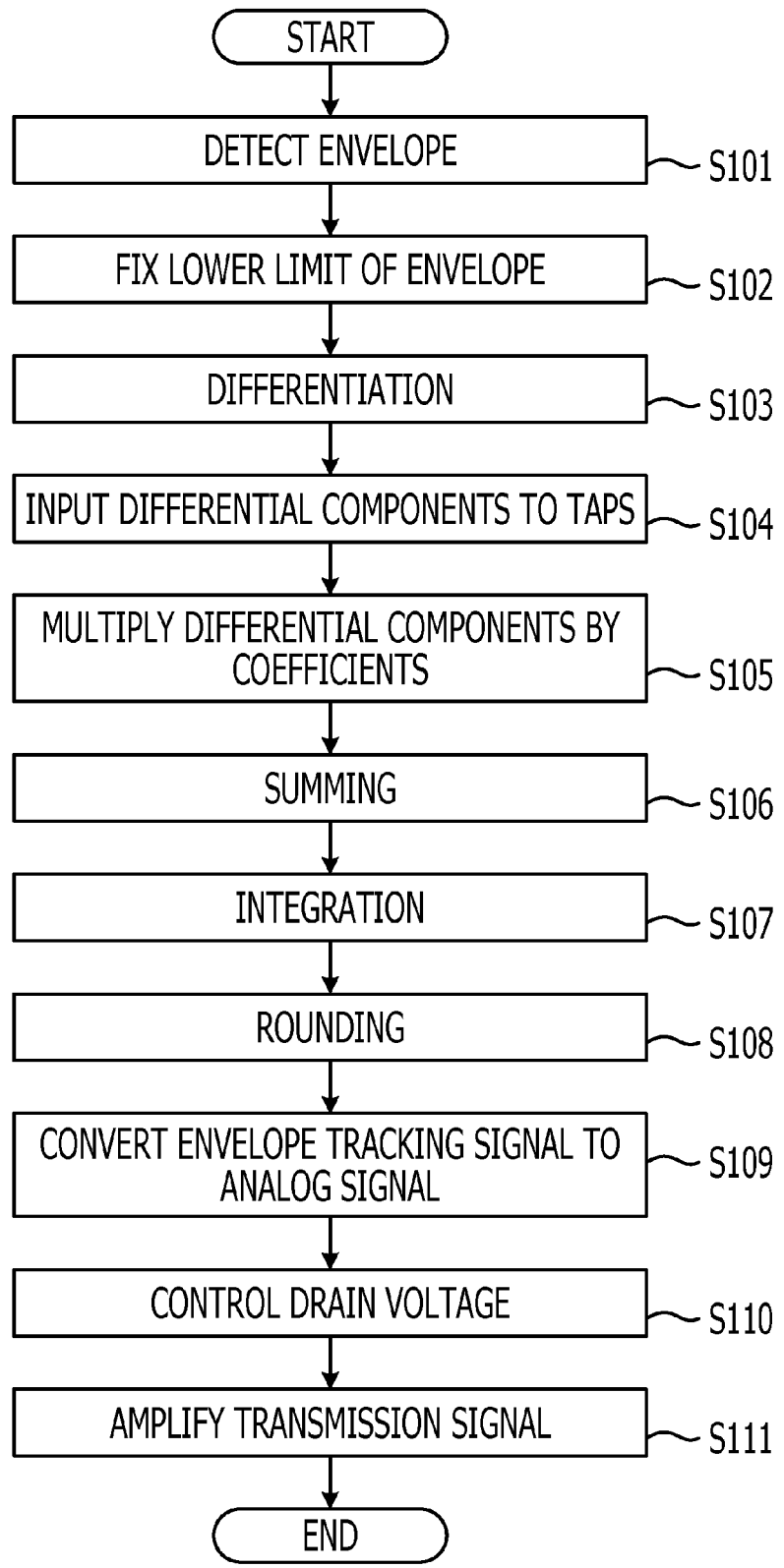
FIG. 7 is a flowchart illustrating a process of signal amplification performed by a transmitter according to an embodiment.
Figure 8:
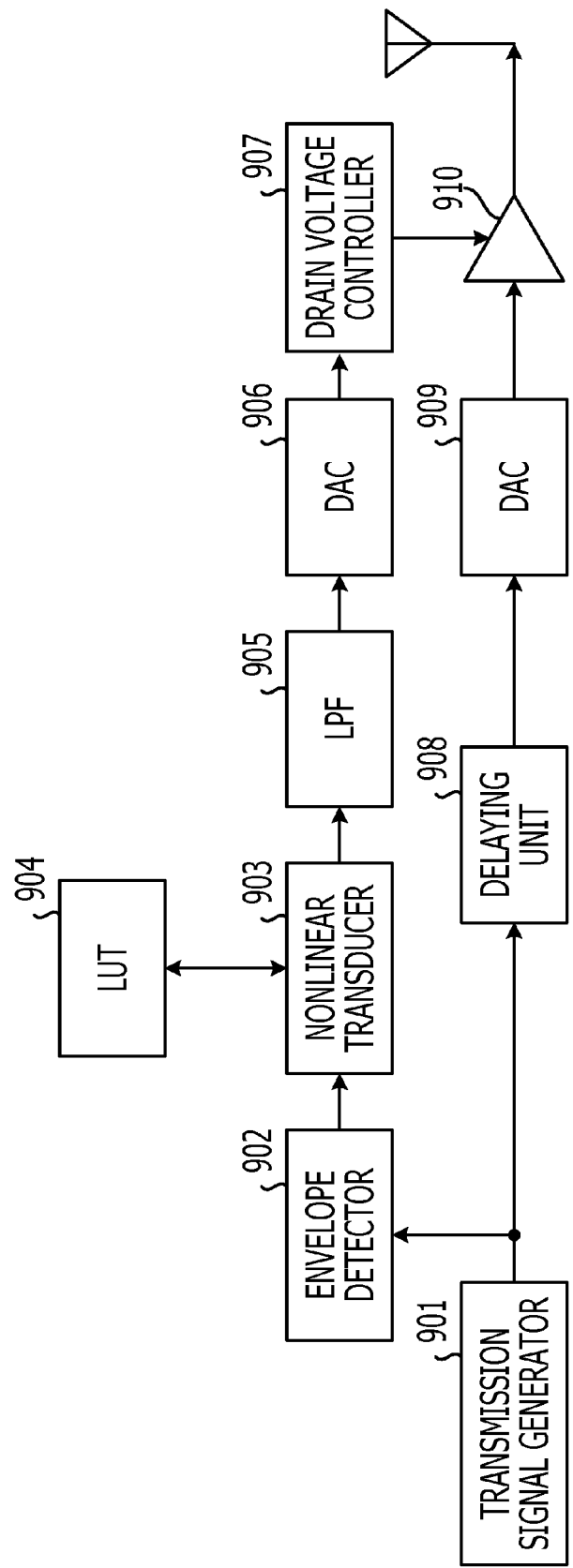
FIG. 8 is a block diagram illustrating a known transmitter including an amplifier that performs drain voltage control.
Figure 9:
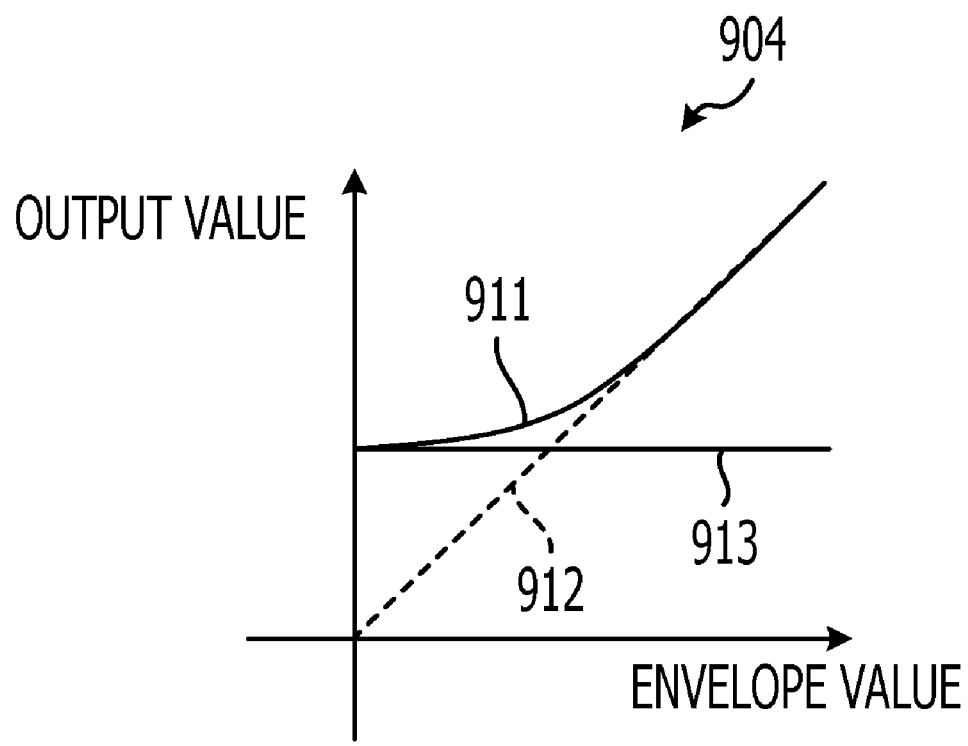
FIG. 9 illustrates a look-up table.

Referring to FIG. 7, a description will be given of a flow of operation of a transmitter serving as an electronic apparatus according to the present embodiment. FIG. 7 is a flowchart illustrating a process of signal amplification performed by a transmitter according to an embodiment.

The envelope detector 22 receives input of a transmission signal from the transmission signal generator 21. The envelope detector 22 then detects an envelope of the transmission signal (step S101).

Of values of the envelope detected by the envelope detector 22, those below a source-voltage-control lower limit are converted to the source-voltage-control lower limit by the lower-limit fixing unit 23 (i.e., a lower limit of the envelope is fixed) (step S102).

The differentiator 11 differentiates a waveform of the envelope whose lower limit is fixed by the lower-limit fixing unit 23, and thus obtains differential components (step S103).

The differentiator 11 sequentially inputs the obtained differential components to the tap 121a of the filtering processor 12. Each of the taps 121 inputs a differential component held therein to the next tap 121. Thus, differential components are input to the respective taps 121 (step S104).

When a tap 121 located to one side of the center tap adjacent to the differentiator 11 holds a positive differential component, the corresponding multiplier 124 multiplies the positive differential component by the coefficient C(p) corresponding to the tap 121. When a tap 121 located to the other side of the center tap remote from the differentiator 11 holds a negative differential component, the corresponding multiplier 124 multiplies the negative differential component by the coefficient C(n) corresponding to the tap 121 (step S105).

The summing unit 125 sums the multiplication results output from the respective multipliers 124 (step S106).

The integrator 13 receives, from the summing unit 125, input of the sum of the differential components by which the respective coefficients are multiplied. The integrator 13 then integrates the sum with respect to time (step S107).

The rounding processor 14 receives input of the integration result from the integrator 13. The rounding processor 14 performs rounding on the integration result (step S108).

Thus, in the process of step S103 to step S108, the nonlinear differential-integral filter 10 generates an envelope tracking signal.

The DAC 24 converts the envelope tracking signal generated by the nonlinear differential-integral filter 10 to an analog signal (step S109).

The drain voltage controller 25 controls a drain voltage of the amplifying unit 28 in accordance with the envelope tracking signal (step S110).

The amplifying unit 28 receives the transmission signal delayed by a predetermined amount of time by the delaying unit 26 and converted to an analog signal by the DAC 27. The amplifying unit 28 then amplifies the transmission signal using the drain voltage controlled by the drain voltage controller 25 (step S111).

As described above, the electronic apparatus according to the present embodiment can generate an envelope tracking signal having a peak that coincides with that of an original envelope in terms of both timing and value. Also, the electronic apparatus according to the present embodiment can generate an envelope tracking signal with which drain voltage control can be performed without unnecessary power consumption. Additionally, the electronic apparatus according to the present embodiment can generate an envelope tracking signal with which drain voltage control can be performed in accordance with a response characteristic of a device that performs drain voltage control. That is, the electronic apparatus according to the present embodiment can generate an envelope tracking signal that has a waveform similar to that of an envelope of an original transmission signal and takes into account a response speed limit and a nonlinear response characteristic of a device that performs drain voltage control. Thus, the electronic apparatus according to the present embodiment can perform drain voltage control in accordance with the response characteristic of the device without unnecessary power consumption.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention.

What is claimed is:

1. An electronic apparatus having communications capabilities, comprising:
    an envelope detector that detects an envelope of a transmission signal;
    a differentiator that differentiates the envelope with respect to time to obtain differential components;
    a filtering processor that filters the differential components;
    an integrator that integrates the filtered differential components with respect to time to generate an envelope tracking signal;
    an amplifying unit that amplifies the transmission signal; and
    a voltage controller that controls, in accordance with the envelope tracking signal, a voltage the amplifying unit uses to amplify the transmission signal, wherein
    the filtering processor performs filtering by multiplying the differential components by respective predetermined coefficients.

2. The electronic apparatus according to claim 1, wherein the predetermined coefficients are selected to be in accordance with a response characteristic of the voltage controller by varying a number of zeros and magnitudes of values.

3. An electronic apparatus having communications capabilities, comprising:
    an envelope detector that detects an envelope of a transmission signal;
    a differentiator that differentiates the envelope with respect to time to obtain differential components;
    a filtering processor that filters the differential components;

an integrator that integrates the filtered differential components with respect to time to generate an envelope tracking signal;
an amplifying unit that amplifies the transmission signal; and
a voltage controller that controls, in accordance with the envelope tracking signal, a voltage the amplifying unit uses to amplify the transmission signal, wherein the filtering processor includes:
a plurality of taps arranged in series and to which, in a direction from one end to another end of the arrangement, respective previous differential components are sequentially input;
first multipliers that multiply, when taps to which differential components older than that held by a center tap at a center of the taps arranged in series are input hold respective positive differential components, the respective positive differential components by respective predetermined coefficients corresponding to the respective taps;
second multipliers that multiply, when taps to which differential components newer than that held by the center tap are input hold respective negative components, the respective negative components by respective predetermined coefficients corresponding to the respective taps; and
a summing unit that sums results of the respective multiplications performed by the first multipliers and the second multipliers.

4. The electronic apparatus according to claim 3, wherein a sum of the predetermined coefficients used by the first multipliers in the multiplications is equal to a sum of the predetermined coefficients used by the second multipliers in the multiplications.

5. An electronic apparatus having communications capabilities, comprising:
an envelope detector that detects an envelope of a transmission signal;
a differentiator that differentiates the envelope with respect to time to obtain differential components;
a filtering processor that filters the differential components;
an integrator that integrates the filtered differential components with respect to time to generate envelope tracking signal;
an amplifying unit that amplifies the transmission signal; and
a voltage controller that controls, in accordance with the envelope tracking signal, a voltage the amplifying unit uses to amplify the transmission signal, wherein the differentiator converts values of the envelope below a lower limit of a source voltage that the voltage controller can control to the lower limit.

6. The electronic apparatus according to claim 1, wherein the integrator rounds a result of the integration.

7. A transmitter comprising:
a transmission signal generator that generates a transmission signal;
an envelope detector that detects an envelope of the transmission signal;
a differentiator that differentiates the envelope with respect to time to obtain differential components;
a filtering processor that filters the differential components;
an integrator that integrates the filtered differential components to generate an envelope tracking signal;
an amplifying unit that amplifies and transmits the transmission signal; and
a voltage controller that controls, in accordance with the envelope tracking signal, a voltage the amplifying unit uses to amplify the transmission signal, wherein
the filtering processor performs filtering by multiplying the differential components by respective predetermined coefficients.

8. An amplifier comprising:
an envelope detector that detects an envelope of a transmission signal;
a differentiator that differentiates the envelope with respect to time to obtain differential components;
a filtering processor that filters the differential components;
an integrator that integrates the filtered differential components with respect to time to generate an envelope tracking signal;
an amplifying unit that amplifies the transmission signal; and
a voltage controller that controls, in accordance with the envelope tracking signal, a voltage the amplifying unit uses to amplify the transmission signal, wherein
the filtering processor performs filtering by multiplying the differential components by respective predetermined coefficients.

9. An amplifier control method comprising:
detecting an envelope of a transmission signal;
differentiating the envelope with respect to time to obtain differential components;
filtering the differential components;
integrating the filtered differential components to obtain an integration result;
controlling, in accordance with the integration result, a voltage used to amplify the transmission signal; and
amplifying the transmission signal in accordance with the controlled voltage, wherein
the filtering is performed by multiplying the differential components by respective predetermined coefficients.

* * * * *